(12) United States Patent
Sugamori

(10) Patent No.: US 6,185,708 B1
(45) Date of Patent: Feb. 6, 2001

(54) MAINTENANCE FREE TEST SYSTEM

(75) Inventor: Shigeru Sugamori, Santa Clara, CA (US)

(73) Assignee: Advantest Corp., Tokyo (JP)

(*) Notice: Under 35 U.S.C. 154(b), the term of this patent shall be extended for 0 days.

(21) Appl. No.: 09/200,909

(22) Filed: Nov. 27, 1998

(51) Int. Cl.[7] ............................ G01R 31/28; G06F 11/00; G06F 7/02

(52) U.S. Cl. ................. 714/724; 714/820; 714/736; 714/738

(58) Field of Search ..................... 714/724, 733, 714/734, 736, 738, 816, 812, 815, 820, 57, 27, 28, 31, 25, 43, 46, 47, 56; 365/230.02, 230.05, 230.06, 189.02

(56) References Cited

U.S. PATENT DOCUMENTS

| | | | |
|---|---|---|---|
| 5,432,791 | * 7/1995 | Gancarcik | 370/516 |
| 5,546,405 | * 8/1996 | Golla | 714/724 |
| 5,621,741 | * 4/1997 | Kohiyama | 714/744 |
| 5,815,511 | * 9/1998 | Yamamoto | 714/733 |

* cited by examiner

Primary Examiner—Trinh L. Tu

(74) Attorney, Agent, or Firm—Muramatsu & Associates

(57) ABSTRACT

A test system for testing a semiconductor device by having a number of test channels (tester pins) corresponding to the number of terminal pins of the semiconductor device to be tested includes: a tester controller for controlling various operations in the tests system including test patterns to be applied to the device under test, timings and waveforms of the test patterns; a test unit for generating the test patterns and expected value patterns with predetermined timings based on control signals from the tester controller; a pin assignment converter provided between the tester controller and the test unit for providing conversion data showing a conversion relationship between physical pin numbers of the test unit and supplemental tester pin numbers which have been replaced with defective tester pins to the test unit; a test head having drivers for supplying the test patterns from the test unit to the semiconductor device with predetermined amplitudes and comparators for detecting levels of output signals from the semiconductor device and comparing the output level with the expected value; a switch circuit provided between the test head and the semiconductor device for changing the defective tester pin to the supplemental tester pin based on the conversion data from the pin assignment converter; and a system monitor for monitoring the change in the tester pins in the test system and other changes involving maintenance works and managing the data thereof.

7 Claims, 4 Drawing Sheets

MAINTENANCE FREE TEST SYSTEM

FIELD OF THE INVENTION

This invention relates to a semiconductor test system for testing semiconductor integrated circuits, and more particularly, to a maintenance free semiconductor test system in which a user of the test system does not need to take any measures or maintenance works against the failures or defects in the semiconductor test system or to recognize the results of such maintenance works.

BACKGROUND OF THE INVENTION

Because the recent semiconductor integrated circuits become more and more complicated and high level, recent semiconductor test systems for testing such integrated circuits also have become more and more complicated and large scale. For example, the number of pins of a recent semiconductor device under test (hereinafter sometimes referred to as "DUT") extends to as many as 1,000, which requires that a semiconductor test system (test system) for testing such a DUT be equipped 1,000 or more test channels (hereafter may also be referred to as "tester pins"). Each tester channel includes a pattern generator, a timing generator, a test waveform formatter, as well as a driver and a comparator to independently supply a desired test pattern to a corresponding pin of the DUT to evaluate the performance at the pin of the DUT.

FIG. 1 is a schematic block diagram showing an example of such a test system. In this example, the test system is illustrated by a combination of basic functional blocks, and thus, each test channel (tester pin) noted above is not shown. In FIG. 1, the test system is comprised of a work station 12, a test controller 14, a test unit 15, and a test head 16 for testing a device under test 18. The work station 12 functions as a user interface and operates under an operating system such as UNIX. The work station 12 may be connected to a network 11 to establish a test system network having a plurality of test systems.

The tester controller 14 is an exclusive processor provided in the test system to control various operations of the test system. The test unit 15 is to provide a test pattern to the device under test and is formed with a pattern generator, a timing generator, a wave formatter and the like. The test head 16 is comprised of a driver for providing a test pattern to the device under test 18 with a predetermined amplitude and threw rate, and a comparator for detecting an output signal level of the device under test 18 and comparing the detected signal with the expected value data. In the above noted configuration of the test system, the test unit 15 and the test head 16 are provided for each tester pin (test channel), the number of the tester pins is the same or greater than the maximum number of pins of the device to be tested.

As in the foregoing, because the test system has a circuit configuration of complicated and large scale, an overall test system of today is a very large system having a large number of components. As a consequence, a test system cannot be completely immune to occurrences of failures and must be prepared to any defects. For example, when a defect is discovered in a certain tester pin of the test system when using the test system or by running a self diagnostic test, a maintenance process will be conducted in which the defective tester pin may be replaced with an interchangeable tester pin (supplemental tester pin).

In such a replacement of components in the test system, however, it is not preferable if the user of the test system must modify the test program for the test system or must prepare a new test program reflecting the changes in the test system, or must keep the data regarding the hardware structural changes in the test system, because it is too burdensome to the user. Therefore, there is a need that the user can use the test system in the same manner as before without worrying about any changes resulted from the maintenance work.

SUMMARY OF THE INVENTION

Therefore, it is an object of the present invention to provide a maintenance free test system which does not require a user to know the changes in the inner hardware structure resulted from the maintenance of the test system.

It is another object of the present invention to provide a maintenance free test system which does not require a user to modify the test program or to use other test program even though there is a change as a result of the maintenance of the test system.

It is a further object of the present invention to provide a maintenance free test system in which the data concerning the changes in the internal hardware or the maintenance history of the test system and the like is managed by a centralized CPU system provided separately from the test system and connected with the test system through a network and system monitor.

It is a further object of the present invention to provide a test system which does not require any changes in the test program even when there arises a failure in a tester pin of the test system by replacing the defective tester pin with a supplemental tester pin and the information regarding the pin change is recorded in the data table of a pin assignment converter.

It is a further object of the present invention to provide a test system which has a pin assignment converter for storing table data showing the relationship between logical pin numbers and physical pin numbers as well as table data showing the relationship between the physical pin numbers and the pin numbers actually used by replacing the defective tester pins.

In the present invention, a test system having a large number of test channels (tester pins) corresponding to the number of terminal pins of a semiconductor device to be tested, includes:

a tester controller for controlling various operations in the tests system including test patterns to be applied to the device under test, timings and waveforms of the test patterns;

a test unit for generating the test patterns and expected value patterns with predetermined timings based on control signals from the tester controller;

a pin assignment converter provided between the tester controller and the test unit for providing conversion data showing a conversion relationship between physical pin numbers of the test unit and supplemental tester pin numbers which have been replaced with defective tester pins to the test unit;

a test head having drivers for supplying the test patterns from the test unit to the semiconductor device with predetermined amplitudes and comparators for detecting levels of output signals from the semiconductor device and comparing the output levels with the expected values;

a switch circuit provided between the test head and the semiconductor device for changing the defective tester pin to the supplemental tester pin based on the conversion data from the pin assignment converter; and a system monitor for monitoring data concerning changes in the tester pins in the test system and modifications involving maintenance works and managing the data thereof.

In the further aspect of the present invention, the test system further includes a work station which functions as a user interface. The user provides various test conditions through the work station to the test program to execute the semiconductor device testing.

When the user sets the test conditions in the test program through the work station, the pin assignment converter produces conversion data which converts the logical tester pin number specified by the user in the test program to the corresponding physical tester pin number.

According to the present invention, the user of the test system does not need to know the changes in the inner hardware structure resulted from the maintenance of the test system. It is not necessary for the user to modify the test program or to use other test program even if there are changes in the inner structure of the test system as a result of the maintenance of the test system. Further, in the test system of the present invention, the data concerning the changes in the internal hardware or the maintenance history of the test system and the like is managed by a centralized CPU system separately provided from the test system and connected with the test system through the system monitor. The test system of the present invention does not require any changes in the test program and is able to continue the device testing even when there arises a failure in the tester pin of the test system by replacing the defective tester pin with the supplemental tester pin and the information regarding the pin change is recorded in the data table of the pin assignment converter.

DETAILED DESCRIPTION OF THE PREFERRED EMBODIMENT

Figure 1:
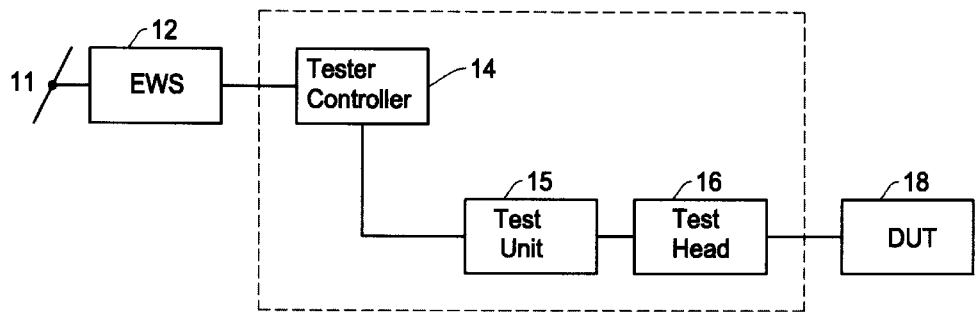
FIG. 1 is a block diagram showing an example of a basic structure of a semiconductor test system ("test system") in the conventional technology.
Figure 2:
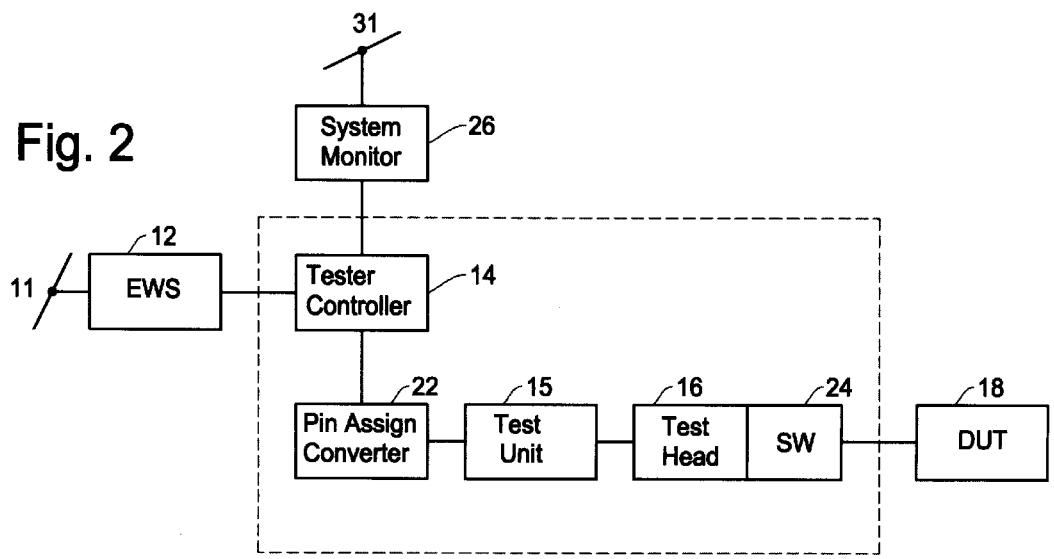
FIG. 2 is a block diagram showing an example of a basic structure of the maintenance free test system of the present invention.

The embodiments of the present invention will be described with reference to the drawings. FIG. 2 is a block diagram showing an example of a basic structure of the maintenance free test system of the present invention. In the test system of the present invention, it is unnecessary for the user to involve in the maintenance process or to know the changes such as the pin the assignment resulted from the maintenance of the test system. In FIG. 1, the maintenance free test system of the present invention is comprised of a work station 12, a system monitor (maintenance processor) 16, a test controller 14, a pin assignment converter 22, a test unit 15, a test head 16 for testing a device under test 18, and a back-up switch circuit 24 provided on the test head. In the above noted configuration of the test system, the test unit 15 and the test head 16 are provided for each tester pin (test channel), the number of the tester pins is equal to or greater than the maximum number of terminal pins of the device to be tested.

Similar to the conventional example of FIG. 1, the work station 12 functions as a user interface and operates under an operating system such as UNIX. The work station 12 may be connected to a network 11 to establish a test system network having a plurality of test systems. The system monitor 26 functions as a maintenance processor via the work station 12 through a dedicated network 31. The maintenance processor 26 may also serve as an interface with another CPU system such as a service center which supports the maintenance work in general through the work station 11. The system monitor 26 monitors the data concerning the maintenance history of the test system, the changes in the hardware (changes in the tester pin assignment) or software resultant to the maintenance work and provides such data to the service center. The connection from the system monitor 26 to the network can be made through a general purpose network, however, the dedicated network is preferable because of the user's needs of confidentiality.

The tester controller 14 is an exclusive processor provided in the test system to control various operations of the test system. The pin assignment converter 22 converts the pin numbers in the software to the actual pin number in the hardware of the test system. As will be described in more detail later, the pin assignment converter 22 has a function of converting the pin number (logical pin number) in the test program executed on the work station by the user to the actual pin number (physical pin number) of the device under test, as well as a function of converting the physical pin number to the replaced pin number (supplemental pin number) which represents the pins actually used as a result of the maintenance process.

The test unit 15 is to provide a test pattern to the device under test and is formed with a pattern generator, a timing generator, and a wave formatter and the like. The test head 16 is comprised of drivers for providing a test pattern to the device under test 18 with a predetermined amplitude and threw rate, and comparators for detecting an output signal level of the device under test 18 and compare the detected signal with the expected data. The back-up switch circuit 24 is provided integrally with the test head 16 and when a certain tester pin is found to be defective, the defective tester pin is replaced with the supplemental pin by the operation of this switch circuit.

The pin assignment operation in the test system of the present invention is described in the following with reference to the circuit example of FIG. 3 and the pin assignment schematic diagram of FIG. 4. As noted above, the maintenance work of the test system is easily carried out by replacing the tester pin having the problem such as a failure with a back-up tester pin. In the case where such a change in the tester hardware arises, it would be too burdensome if the user of the test system must modify the test program for the test system or must prepare a new test program reflecting the change in the test system.

Therefore, in the test system of the present invention, using the pin assignment converter 22 which converts the physical pin number that has been replaced with the supplemental pin, the modification of the test program becomes unnecessary. Further, as noted above, the pin assignment converter 22 of the present invention also functions to convert the logical pin number in the test program initiated by the user on the work station to the physical pin number of the device under test.

The need to convert the physical pin number to the maintenance supplemental pin number is apparent in view of the foregoing description. In the following, brief explanation is made regarding the need to convert the logical pin number to the physical pin number. More detailed description is given in the Japanese Patent Application No. 10-192050 filed by the same assignee of the present invention. Generally, semiconductor chips are mounted in various kinds of packages. Since the inner wiring is different from package to package, the pins of the semiconductor devices have different pin assignment if the same semiconductor chips are installed in difference semiconductor packages.

When the user sets various test conditions in the test program through the work station, by specifying the logical pin numbers concerning the test units 15 and the test heads 16 which are imaginary pin number on the software. However, as noted above, the inner wiring or pin alignment of the semiconductor device under test varies even for the same semiconductor chip when the chip is mounted in a different package. Thus, in testing the semiconductor device, the logical pin number specified in the test program must be converted to the physical pin number which is the hardware pin number corresponding to the actual test unit 15 and test head 16. Therefore, the pin assignment converter 22 of the present invention has a function of not only converting the physical pin number to the supplemental pin number replacing the defective pin, but of also converting the logical pin number to the physical pin number.

Figures 3, 4A, 4B, 4C:
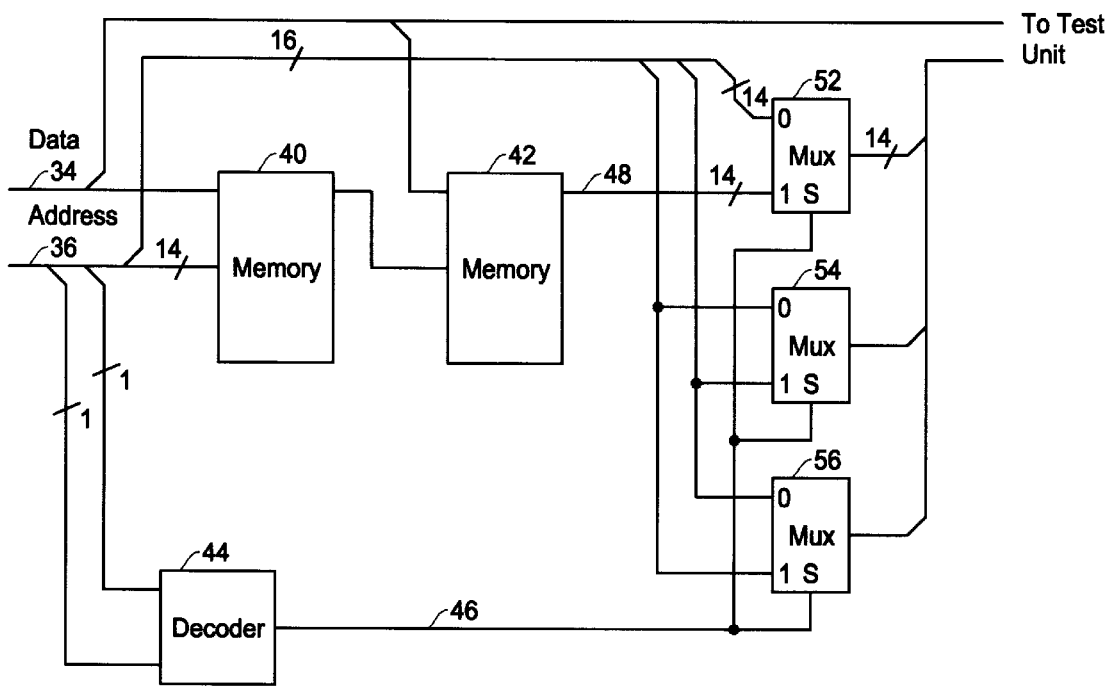
FIG. 3 is a block diagram showing an example of a circuit configuration in the pin assignment converter to be used in the test system of the present invention.
FIGS. 4A–4C are schematic diagrams showing pin assignment data to be stored in the pin assignment converter of FIG. 3.

In the example of FIG. 3, the pin assignment converter 22 of the present invention is formed with pin assignment memories 40 and 42, a decoder 44, and multiplexers 52, 54 and 56. For the simplicity of explanation, only one set of the multiplexers 52, 54 and 56 is shown, although in the actual test system, a large number of sets of multiplexers will be used corresponding to the number of tester pins. In this example, the memory 40 stores the table data for converting the logical pin number to the physical pin number, and the memory 42 stores the table data for converting the physical pin number to the actually used pin (supplemental pin) number.

The table data may be stored in the memories 40 and 42 by, for example, a manufacturer of the test system before the test system is delivered to the user. In the case where the test system experiences a failure after being accepted by the user, an engineer who was in charge of the maintenance work of the test system may install the data for converting the physical pin number into the actually used pin number in the memory 42 through the tester controller 14.

As a consequence, the user of the test system is not required to recognize the physical pin number of the supplemental pin number that is used for replacing the defective pin in the test system. The user can set the various test conditions in the test program based only on the logical pin number. In the setting of the test conditions, by defining the package type of the device under test, the corresponding address data is transferred to the pin assignment converter 22 so that the conversion table data in the pin assignment memory 40 is specified. There is no need for the user to define the conversion table data in the memory 42.

In testing the device under test 18 by the test system, the pin assignment converter 22 in FIG. 3 is provided with data 34 and address 36 from the tester controller 14. For example, fourteen (14) bits out of the address signal 36 specify the address of the pin assignment memory 40. The data table such as shown in FIG. 4A is formed in the pin assignment memory 40. In the example of FIG. 4A, the data column in the left shows the logical pin number specified by the user when setting the test conditions in the test program. The logical pin number may, for example, be identical to the address number of the memory 40. The data column in the right of FIG. 4A shows the physical pin number of the hardware in the test system corresponding to the logical pin number. The physical pin numbers are pre-stored in the memory depending on the package type and the like of the device under test. Thus, the data specified by the fourteen bits address signal is converted to the physical pin number and is output from the memory 40.

In the example of FIG. 3, the output data from the memory 40 is provided to the memory 42 as address data. As shown in FIG. 4B, the table data stored in the memory 42 ordinarily shows the physical pin number which is the same as the actually used pin number. However, in the case where there is a failure in the test system and the maintenance is undertaken in which the defective pin is replaced with a supplemental pin, a service engineer changes the data in the memory 42 to such as shown in FIG. 4C. In the example of FIG. 4C, since the physical pin number 40 is defective, the pin number 40 and all the other pin numbers after that are shifted by one.

In the circuit example of the pin assignment converter of FIG. 3, a part of the address signal 36 is supplied to the decoder 44 as selection bits to determine whether the pin number conversion is required or not. If the selection bits show that the pin number conversion is necessary, the decoder 44 makes the output signal therefrom active (selection signal). The selection signal 46 is provided to the control inputs of the multiplexers 52, 54 and 56 so that the data from the pin assignment memories 40 and 42 specified by the address data is supplied to the test unit 15 and the test head 16 through the multiplexers. The tester pins specified by the data from the pin assignment converter 22 are used in the actual test of the semiconductor device.

The data stored in the pin assignment converter 22 is monitored by the system monitor 26 and is set to, for example, a CPU system (service center) organized, for example, by a manufacturer of the test system for a service purpose through the exclusive network 31. Therefore, the service center can acquire at any time the data regarding the changes in the hardware of the test system resulted from the maintenance work and the maintenance history.

Figure 5:
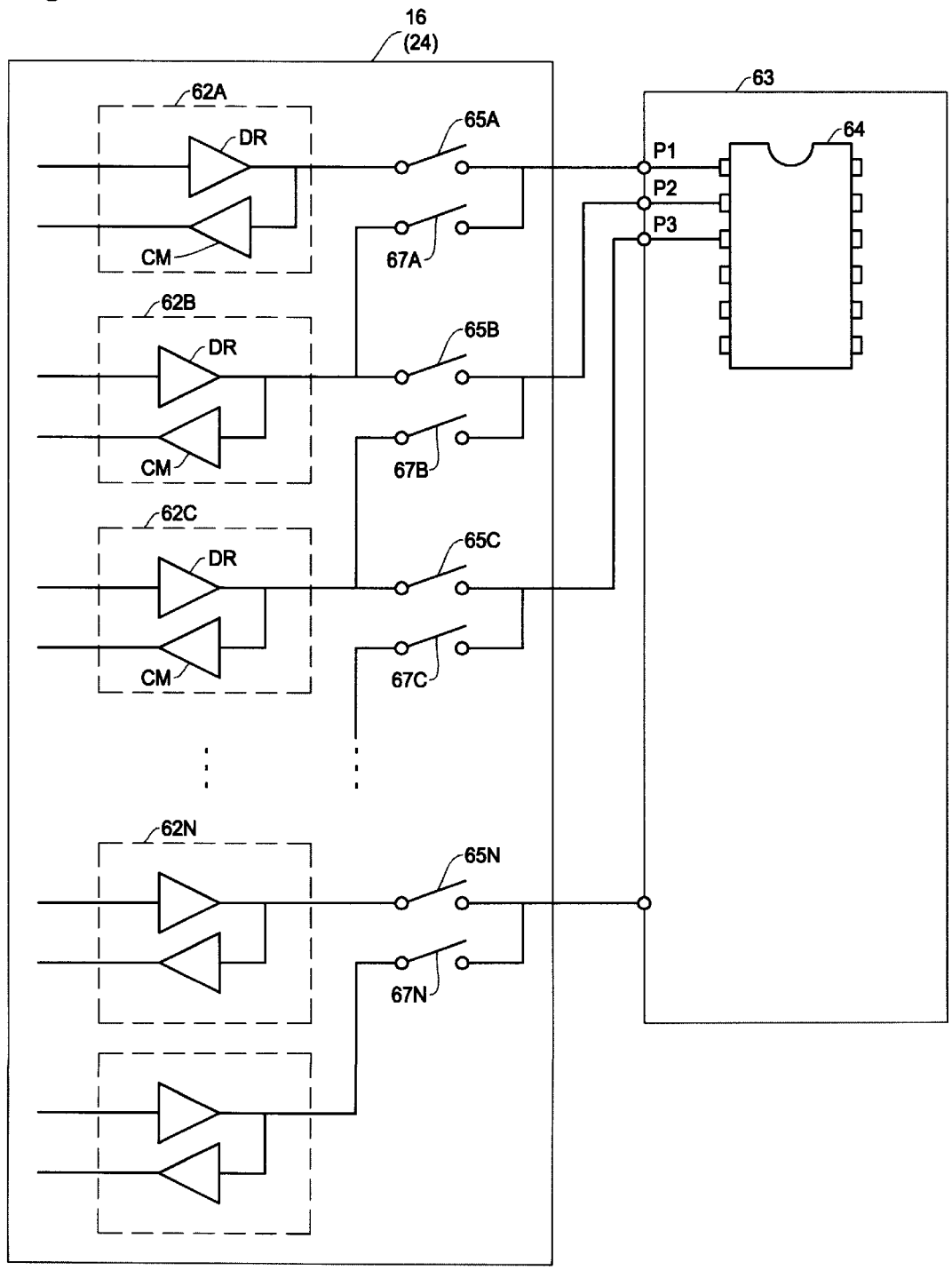
FIG. 5 is a block diagram showing an example of a back-up switch circuit to be used in the test head of the test system of the present invention for replacing a defective pin with a supplemental pin.
Figure 6:
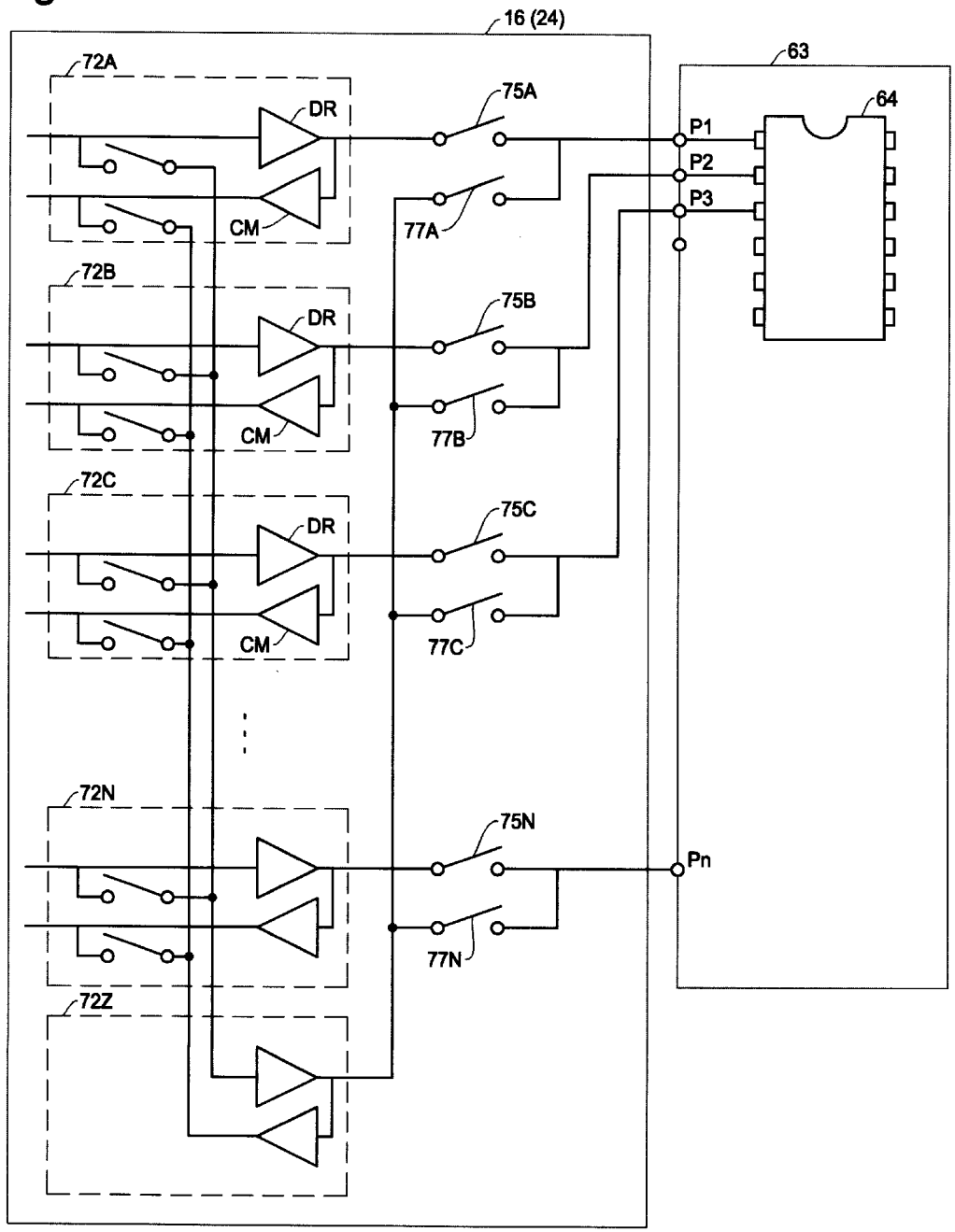
FIG. 6 is a block diagram showing another example of a back-up switch circuit to be used in the test head of the test system of the present invention for replacing a defective pin with a supplemental pin.

FIGS. 5 and 6 show circuit examples in the last stage of the test head 16 and the back-up switch circuit 24 connected to the test head. As noted above, the maintenance process is carried out by replacing the defective pins with supplemental pins. The back-up switch circuit 24 includes a group of switches to change the defective pins to the supplemental pins, the process of which will be briefly explained in the following. The more detailed description is given in the Japanese Patent Application No. 7-341098 filed by the same assignee of the present invention.

In FIG. 5, the test head 16 includes driver and comparator pairs 62A–62Z corresponding to each tester pin and the switch circuit 24 includes switches 65A–65Z and switches 67A–67N to change the connection of the driver comparator pairs. The device under test 64 is placed for example on a performance board 63 and its input and output pins are connected to the test head 16 through the switch circuit 24. In this example, the driver comparator 62Z is a supplemental circuit provided for a back-up purpose. For simplicity of description, only one supplemental circuit is shown here, although a plurality of such circuits will be prepared in the configuration of the actual test system.

In the configuration of FIG. 5, in the case where the defective pin is found, the pin number of the defective pin and other pins after the defective pin may be shifted to the next pin as in the example of FIG. 4C. For example, if the tester pin corresponding to the driver comparator pair 62B is defective, the driver comparator pair 62B is replaced with the next driver comparator pair 62C. For doing this, the switch 65B is set to OFF, the switch 67B is set to ON, the switch 65C is OFF, the switch 67C is ON . . . to shift the connection to the next. As a result, the defective tester pin is replaced with the supplemental pin without causing any adverse affects to the device under test 64.

In the configuration of FIG. 6, in each of the driver comparator pairs 72A–72Z is provided with a driver input change-over switch and a comparator output change-over switch, respectively. In this example, the driver comparator pair 72Z is a supplemental circuit provided for the back-up purpose. All of the driver input change-over switches and the comparator output change-over switches are commonly connected to the supplemental pair 72Z. In this example, only the driver comparator pair in the defective tester pin is replaced with the supplemental circuit. For example, when the tester pin including the driver comparator pair 72B is defective, the switch 75B is set to OFF and the switch 77B is set to ON, thereby replacing the driver comparator pair 72B with the supplemental pair 72Z.

As described in the foregoing, according to the present invention, the user of the test system the user does not need to know the changes in the inner hardware structure resulted from the maintenance of the test system. It is not necessary for the user to modify the test program or to use other test program even if there are changes in the inner structure of the test system as a result of the maintenance of the test system. Further, in the test system of the present invention, the data concerning the changes in the internal hardware or the maintenance history of the test system and the like is managed by the centralized CPU system separately provided from the test system and connected with the test system through the system monitor. The test system of the present invention does not require any changes in the test program and is able to continue the device testing even when there arises a failure in a tester pin in the test system by replacing the defective tester pin with the supplemental tester pin and the information regarding the pin change is recorded in the data table of the pin assign converter.

What is claimed is:

1. A test system for testing a semiconductor device by having a number of tester pins corresponding to the number of terminal pins of the semiconductor device to be tested, comprising:

a tester controller for controlling various operations in the tests system including test patterns to be applied to the semiconductor device, timings and waveforms of the test patterns;

a test unit for generating the test patterns and expected value patterns with predetermined timings based on control signals from the tester controller;

a pin assignment converter provided between the tester controller and the test unit for providing conversion data showing a conversion relationship between physical pin numbers of the test unit and supplemental tester pin numbers which have been replaced with defective tester pins to the test unit;

a test head having drivers for supplying the test patterns from the test unit to the semiconductor device with predetermined amplitudes and comparators for detecting levels of output signals from the semiconductor device and comparing the output levels with the expected values;

a switch circuit provided between the test head and the semiconductor device for changing the defective tester pin to the supplemental tester pin based on the conversion data from the pin assignment converter; and a system monitor for monitoring changes in the tester pins in the test system and other changes involving maintenance works and managing the data thereof.

2. A test system as defined in claim 1, further comprising a work station which functions as an interface between the test system and a user wherein the user provides the various test conditions in a test program through the work station to carry out the semiconductor device testing.

3. A test system as defined in claim 1, further comprising a work station which functions as an interface between the test system and a user wherein the user provides the various test conditions in a test program through the work station to carry out the semiconductor device testing, and wherein the pin assignment converter generates the conversion data which further includes information for replacing logical tester pin numbers specified by the user in the test program through the work station with the physical tester pin numbers.

4. A test system as defined in claim 3, wherein the pin assignment converter includes a first memory for storing data converting the logical tester pin numbers to the physical tester pin numbers, a second memory for storing data converting the logical tester pin numbers to the supplemental tester pin numbers, and a multiplexer for selectively outputting the data from the first and second memories.

5. A test system as defined in claim 1, wherein the system monitor transfers information concerning the maintenance work of the test system to a service center through a dedicated network.

6. A test system as defined in claim 1, a work station is further used as an interface with other test systems through a general purpose network.

7. A test system for testing a semiconductor device by having a number of tester pins corresponding to the number of terminal pins of the semiconductor device to be tested, comprising:

a work station which functions as an interface between the test system and a user of the test system;

a tester controller for controlling various operations in the tests system including test patterns to be applied to the semiconductor device, timings and waveforms of the test patterns;

a test unit for generating the test patterns and expected value patterns with predetermined timings based on control signals from the tester controller;

a pin assignment converter provided between the tester controller and the test unit for providing first conversion data and second conversion data to the test unit, the first conversion data showing a conversion relationship between logical tester pin numbers and physical tester pin numbers of the test unit, and the second conversion data showing a conversion relationship between physical pin numbers of the test unit and supplemental tester pin numbers which have been replaced with defective tester pins;

a test head having drivers for supplying the test patterns from the test unit to the semiconductor device with predetermined amplitudes and comparators for detecting levels of output signals from the semiconductor device and comparing the output levels with the expected values;

a switch circuit provided between the test head and the semiconductor device for changing the defective tester pin to the supplemental tester pin based on the conversion data from the pin assignment converter; and a system monitor for monitoring the change in the tester pins in the test system and other changes involving maintenance works and managing the data thereof.

* * * * *